(12) United States Patent
Kagan

(10) Patent No.: US 9,891,253 B2
(45) Date of Patent: Feb. 13, 2018

(54) BLUETOOTH-ENABLED INTELLIGENT ELECTRONIC DEVICE

(71) Applicant: Electro Industries/Gauge Tech, Westbury, NY (US)

(72) Inventor: Erran Kagan, Great Neck, NY (US)

(73) Assignee: Electro Industries/Gauge Tech, Westbury, NY (US)

( * ) Notice: Subject to any disclaimer, the term of this patent is extended or adjusted under 35 U.S.C. 154(b) by 0 days.

(21) Appl. No.: 13/968,584

(22) Filed: Aug. 16, 2013

(65) Prior Publication Data

US 2013/0329768 A1    Dec. 12, 2013

Related U.S. Application Data

(63) Continuation of application No. 11/589,377, filed on Oct. 30, 2006, now Pat. No. 8,515,348.

(60) Provisional application No. 60/731,073, filed on Oct. 28, 2005.

(51) Int. Cl.
*G01R 22/06* (2006.01)
*H04W 76/02* (2009.01)
*G01R 22/10* (2006.01)

(52) U.S. Cl.
CPC ........ *G01R 22/063* (2013.01); *H04W 76/023* (2013.01); *G01R 22/10* (2013.01)

(58) Field of Classification Search
USPC .............. 455/41.2; 702/62, 57, 189, 61; 709/220–223, 217, 228
See application file for complete search history.

(56) References Cited

U.S. PATENT DOCUMENTS

| | | | |
|---|---|---|---|
| 1,863,741 A | | 6/1932 | Bouthillon |
| 2,292,163 A | | 8/1942 | Shea |
| 3,656,112 A | | 4/1972 | Paull |
| 5,243,338 A | * | 9/1993 | Brennan et al. ......... 340/870.02 |
| 5,315,527 A | | 5/1994 | Beckwith |
| 5,347,464 A | | 9/1994 | McEachern et al. |
| 5,544,064 A | | 8/1996 | Beckwith |

(Continued)

OTHER PUBLICATIONS

Xu Hong, Wang Jianhua, "An Extendable Data Engine based on OPC Specification"; Computer Standards & Interfaces 26 (2004) 515-525; Dec. 5, 2003.

(Continued)

*Primary Examiner* — Gennadiy Tsvey
(74) *Attorney, Agent, or Firm* — Gerald E. Hespos; Michael J. Porco; Matthew T. Hespos

(57) ABSTRACT

An intelligent electronic device (IED), e.g., an electrical power meter, having wireless communication capabilities, e.g., Bluetooth connectivity, for transmitting and receiving data without a hardwire connection is provided. A system and method for retrieving revenue metering data from at least one IED, e.g., a revenue meter, are also provided. The system includes at least one intelligent electronic device including a transceiver configured for receiving calculated energy consumption data from a processor and transmitting the calculated energy consumption data via a spread-spectrum frequency hopping technique; and a data collection device configured for receiving the calculated energy consumption data from the at least one intelligent electronic device in response to supplying a pairing passkey to the intelligent electronic device.

25 Claims, 5 Drawing Sheets

(56) References Cited

U.S. PATENT DOCUMENTS

| | | | |
|---|---|---|---|
| 5,559,719 | A | 9/1996 | Johnson et al. |
| 5,574,654 | A | 11/1996 | Bingham et al. |
| 5,581,173 | A | 12/1996 | Yalla et al. |
| 5,650,936 | A | 7/1997 | Loucks et al. |
| 5,706,204 | A | 1/1998 | Cox et al. |
| 5,736,847 | A | 4/1998 | Van Doorn et al. |
| 5,764,523 | A | 6/1998 | Yoshinaga et al. |
| 5,774,366 | A | 6/1998 | Beckwith |
| 5,801,643 | A | 9/1998 | Williams et al. |
| 5,819,203 | A | 10/1998 | Moore et al. |
| 5,822,165 | A | 10/1998 | Moran |
| 5,828,576 | A | 10/1998 | Loucks et al. |
| 5,832,210 | A | 11/1998 | Akiyama et al. |
| 5,874,903 | A | 2/1999 | Shuey et al. |
| 5,898,387 | A | 4/1999 | Davis et al. |
| 5,899,960 | A | 5/1999 | Moore et al. |
| 5,963,146 | A * | 10/1999 | Johnson et al. .......... 340/870.01 |
| 5,978,655 | A | 11/1999 | Ohura et al. |
| 5,986,574 | A | 11/1999 | Colton |
| 5,995,911 | A | 11/1999 | Hart |
| 6,000,034 | A | 12/1999 | Lightbody et al. |
| 6,011,519 | A | 1/2000 | Sadler et al. |
| 6,018,690 | A | 1/2000 | Saito et al. |
| 6,038,516 | A | 3/2000 | Alexander et al. |
| 6,073,169 | A | 6/2000 | Shuey et al. |
| D427,533 | S | 7/2000 | Cowan et al. |
| D429,655 | S | 8/2000 | Cowan et al. |
| 6,098,175 | A | 8/2000 | Lee |
| 6,100,817 | A | 8/2000 | Mason et al. |
| D435,471 | S | 12/2000 | Simbeck et al. |
| 6,157,329 | A | 12/2000 | Lee |
| 6,172,616 | B1 | 1/2001 | Johnson et al. |
| 6,185,508 | B1 | 2/2001 | Van Doorn et al. |
| 6,186,842 | B1 | 2/2001 | Hirschbold et al. |
| 6,195,614 | B1 | 2/2001 | Kochan |
| D439,535 | S | 3/2001 | Cowan et al. |
| 6,236,949 | B1 | 5/2001 | Hart |
| D443,541 | S | 6/2001 | Hancock et al. |
| 6,289,267 | B1 | 9/2001 | Alexander et al. |
| 6,363,057 | B1 | 3/2002 | Ardalan et al. |
| 6,396,839 | B1 | 5/2002 | Ardalan et al. |
| 6,397,155 | B1 | 5/2002 | Przydatek et al. |
| D458,863 | S | 6/2002 | Harding et al. |
| D459,259 | S | 6/2002 | Harding et al. |
| 6,437,692 | B1 | 8/2002 | Petite et al. |
| 6,493,644 | B1 | 12/2002 | Jonker et al. |
| 6,519,537 | B1 | 2/2003 | Yang et al. |
| 6,528,957 | B1 | 3/2003 | Luchaco |
| 6,538,577 | B1 | 3/2003 | Ehrke et al. |
| 6,563,697 | B1 | 5/2003 | Simback et al. |
| 6,611,773 | B2 | 8/2003 | Przydatek et al. |
| 6,611,922 | B2 | 8/2003 | Ozcetin et al. |
| 6,615,147 | B1 | 9/2003 | Jonker et al. |
| 6,636,030 | B1 | 10/2003 | Rose et al. |
| 6,557,552 | B1 | 12/2003 | Belshi et al. |
| 6,671,635 | B1 | 12/2003 | Forth et al. |
| 6,671,654 | B1 | 12/2003 | Forth et al. |
| 6,671,802 | B1 | 12/2003 | Ott |
| 6,687,627 | B1 | 2/2004 | Gunn et al. |
| 6,694,270 | B2 | 2/2004 | Hart |
| 6,717,394 | B2 | 4/2004 | Elms |
| 6,735,535 | B1 | 5/2004 | Kagan et al. |
| 6,737,855 | B2 | 5/2004 | Huber et al. |
| 6,745,138 | B2 | 6/2004 | Przydatek et al. |
| 6,751,562 | B1 | 6/2004 | Blackett et al. |
| 6,751,563 | B2 | 6/2004 | Spanier et al. |
| 6,792,337 | B2 | 9/2004 | Blackett et al. |
| 6,792,364 | B2 | 9/2004 | Jonker et al. |
| 6,798,190 | B2 | 9/2004 | Harding et al. |
| 6,798,191 | B1 | 9/2004 | Macfarlane et al. |
| 6,804,357 | B1 * | 10/2004 | Ikonen ................ H04N 7/1675 348/14.01 |
| 6,813,571 | B2 | 11/2004 | Lightbody et al. |
| 6,825,776 | B2 | 11/2004 | Lightbody et al. |
| 6,836,737 | B2 | 12/2004 | Petite et al. |
| 6,842,707 | B2 | 1/2005 | Raichle et al. |
| 6,853,978 | B2 | 2/2005 | Forth et al. |
| 6,871,150 | B2 | 3/2005 | Huber et al. |
| 6,871,654 | B1 | 3/2005 | Berke et al. |
| 6,873,836 | B1 * | 3/2005 | Sorrells ................ H03C 3/40 455/113 |
| D505,087 | S | 5/2005 | Ricci et al. |
| 6,900,738 | B2 | 5/2005 | Crichlow |
| 6,944,555 | B2 | 9/2005 | Blackett et al. |
| 6,957,158 | B1 | 10/2005 | Hancock et al. |
| 6,961,641 | B1 | 11/2005 | Forth et al. |
| 6,983,211 | B2 | 1/2006 | Macfarlene et al. |
| 6,985,087 | B2 | 1/2006 | Soliman |
| 6,988,025 | B2 | 1/2006 | Ransom et al. |
| 6,988,182 | B2 | 1/2006 | Teachman et al. |
| 6,990,395 | B2 | 1/2006 | Ransom et al. |
| 7,006,934 | B2 | 2/2006 | Jonker et al. |
| 7,010,438 | B2 | 3/2006 | Hancock et al. |
| 7,043,459 | B2 | 5/2006 | Peevey |
| 7,049,975 | B2 | 5/2006 | Vanderah et al. |
| 7,050,808 | B2 | 5/2006 | Janusz et al. |
| 7,072,779 | B2 | 7/2006 | Hancock et al. |
| 7,085,824 | B2 | 8/2006 | Forth et al. |
| 7,089,089 | B2 | 8/2006 | Cumming et al. |
| 7,127,328 | B2 | 10/2006 | Ransom |
| D532,747 | S | 11/2006 | Ricci et al. |
| 7,136,384 | B1 | 11/2006 | Wang |
| D534,120 | S | 12/2006 | Ricci et al. |
| 7,155,350 | B2 | 12/2006 | Kagan |
| 7,158,050 | B2 | 1/2007 | Lightbody et al. |
| 7,174,258 | B2 | 2/2007 | Hart |
| 7,174,261 | B2 | 2/2007 | Gunn et al. |
| 7,184,904 | B2 | 2/2007 | Kagan |
| 7,188,003 | B2 | 3/2007 | Ransom et al. |
| 7,191,076 | B2 | 3/2007 | Huber et al. |
| 7,196,673 | B2 | 3/2007 | Savage et al. |
| 7,216,043 | B2 | 5/2007 | Ransom et al. |
| 7,243,050 | B2 | 7/2007 | Armstrong |
| 7,246,014 | B2 | 7/2007 | Forth et al. |
| 7,248,977 | B2 | 7/2007 | Hart |
| 7,248,978 | B2 | 7/2007 | Ransom |
| 7,249,265 | B2 | 7/2007 | von Carolsfeld et al. |
| 7,256,709 | B2 | 8/2007 | Kagan |
| 7,271,996 | B2 | 9/2007 | Kagan et al. |
| 7,294,997 | B2 | 11/2007 | Kagan |
| 7,304,586 | B2 | 12/2007 | Wang et al. |
| 7,305,310 | B2 | 12/2007 | Slota et al. |
| 7,337,081 | B1 | 2/2008 | Kagan |
| 2001/0010689 | A1 | 8/2001 | Awater et al. |
| 2001/0038343 | A1 | 11/2001 | Meyer et al. |
| 2002/0018399 | A1 | 2/2002 | Schultz et al. |
| 2002/0032535 | A1 | 3/2002 | Alexnader et al. |
| 2002/0054619 | A1 | 5/2002 | Haas |
| 2002/0105435 | A1 | 8/2002 | Yee et al. |
| 2002/0109608 | A1 | 8/2002 | Petite et al. |
| 2002/0112183 | A1 * | 8/2002 | Baird, III ............... H04L 63/083 726/9 |
| 2002/0114326 | A1 | 8/2002 | Mahalingaiah |
| 2002/0120723 | A1 | 8/2002 | Forth et al. |
| 2002/0129342 | A1 | 9/2002 | Kil et al. |
| 2002/0162014 | A1 | 10/2002 | Przydatek et al. |
| 2002/0165677 | A1 | 11/2002 | Lightbody et al. |
| 2002/0169570 | A1 * | 11/2002 | Spanier et al. ................. 702/61 |
| 2002/0172190 | A1 * | 11/2002 | Vatanen ................ H04W 12/10 370/352 |
| 2003/0014200 | A1 | 1/2003 | Jonker et al. |
| 2003/0065459 | A1 | 4/2003 | Huber et al. |
| 2003/0093429 | A1 | 5/2003 | Nishikawa et al. |
| 2003/0101008 | A1 | 5/2003 | Hart |
| 2003/0105608 | A1 | 6/2003 | Hart |
| 2003/0132742 | A1 | 7/2003 | Harding et al. |
| 2003/0154471 | A1 | 8/2003 | Teachman et al. |
| 2003/0167178 | A1 | 9/2003 | Jarman et al. |
| 2003/0178982 | A1 | 9/2003 | Elms |
| 2003/0187550 | A1 | 10/2003 | Wilson et al. |
| 2003/0210699 | A1 | 11/2003 | Holt, Sr. et al. |
| 2003/0212512 | A1 | 11/2003 | Hart |
| 2003/0220752 | A1 | 11/2003 | Hart |
| 2003/0226058 | A1 | 12/2003 | Miller et al. |

(56) References Cited

U.S. PATENT DOCUMENTS

| | | |
|---|---|---|
| 2004/0066311 A1 | 4/2004 | Giles et al. |
| 2004/0083066 A1 | 4/2004 | Hayes et al. |
| 2004/0113810 A1 | 6/2004 | Mason, Jr. et al. |
| 2004/0122833 A1 | 6/2004 | Forth et al. |
| 2004/0128260 A1 | 7/2004 | Amedure et al. |
| 2004/0138786 A1 | 7/2004 | Blackett et al. |
| 2004/0138787 A1 | 7/2004 | Ransom et al. |
| 2004/0138835 A1 | 7/2004 | Ransom et al. |
| 2004/0172207 A1 | 9/2004 | Hancock et al. |
| 2004/0177062 A1 | 9/2004 | Urquhart et al. |
| 2004/0183522 A1 | 9/2004 | Gunn et al. |
| 2004/0193329 A1 | 9/2004 | Ransom et al. |
| 2004/0203988 A1 | 10/2004 | Yang |
| 2004/0208182 A1 | 10/2004 | Boles et al. |
| 2004/0229578 A1 | 11/2004 | Lightbody et al. |
| 2004/0258135 A1* | 12/2004 | Higgins, Jr. ............ H04B 1/715 375/132 |
| 2005/0017874 A1 | 1/2005 | Lightbody et al. |
| 2005/0027464 A1 | 2/2005 | Jonker et al. |
| 2005/0060110 A1 | 3/2005 | Jones et al. |
| 2005/0065742 A1* | 3/2005 | Rodgers ................ G01D 4/004 702/62 |
| 2005/0071106 A1 | 3/2005 | Huber et al. |
| 2005/0093571 A1 | 5/2005 | Suaris et al. |
| 2005/0184881 A1 | 8/2005 | Dusenberry et al. |
| 2005/0187725 A1 | 8/2005 | Cox |
| 2005/0210283 A1 | 9/2005 | Kato |
| 2005/0273280 A1 | 12/2005 | Cox |
| 2005/0275397 A1 | 12/2005 | Lightbody et al. |
| 2005/0288876 A1 | 12/2005 | Doig et al. |
| 2005/0288877 A1 | 12/2005 | Doig et al. |
| 2006/0047787 A1 | 3/2006 | Agarwal et al. |
| 2006/0052958 A1 | 3/2006 | Hancock et al. |
| 2006/0066903 A1 | 3/2006 | Shiimori |
| 2006/0071813 A1 | 4/2006 | Kagan |
| 2006/0077999 A1 | 4/2006 | Kagan et al. |
| 2006/0085419 A1 | 4/2006 | Rosen |
| 2006/0086893 A1 | 4/2006 | Spanier et al. |
| 2006/0145843 A1* | 7/2006 | Lin .......................... 340/539.26 |
| 2006/0161400 A1 | 7/2006 | Kagan |
| 2006/0170409 A1 | 8/2006 | Kagan et al. |
| 2006/0200599 A1 | 9/2006 | Manchester et al. |
| 2006/0230394 A1 | 10/2006 | Forth et al. |
| 2006/0271244 A1 | 11/2006 | Cumming et al. |
| 2007/0057812 A1 | 3/2007 | Cornwall |
| 2007/0058634 A1 | 3/2007 | Gupta et al. |
| 2007/0067119 A1 | 3/2007 | Loewen et al. |
| 2007/0067121 A1 | 3/2007 | Przydatek et al. |
| 2007/0096942 A1 | 5/2007 | Kagan et al. |
| 2007/0136010 A1 | 6/2007 | Gunn et al. |
| 2008/0046205 A1 | 2/2008 | Gilbert et al. |
| 2008/0065335 A1 | 3/2008 | Doig et al. |

OTHER PUBLICATIONS

The Dranetz Field Handbook for Power quality Analysis; Dranetz Technologies Incorporated, Edison, NJ; Copyright 1991; pp. 1-271.

Power Platform 4300 Multi-DAQ TASKCard Operator's Manual; Dranetz-BMI, Original Issue—Jul. 2002, pp. 1-203.

Power Platform PP1 & PP1E TASKCard-Inrush Operator's Manual; Dranetz-BMI, Revision A—Apr. 15, 1997, pp. 1-231.

PDA 1252 Portable Analyzer, Installation & Operation Manual; Electro Industries/Gauge Tech; Version 1.01, Jul. 14, 2005; Doc # E148701; pp. 1-136.

PDA 1252 Watertight Portable Power Quality Analyzer, Brochure; Electro Industries/Gauge Tech; Dec. 23, 2005; Doc # E148702; pp. 1-4.

* cited by examiner

BLUETOOTH-ENABLED INTELLIGENT ELECTRONIC DEVICE

This application is a continuation application of U.S. application Ser. No. 11/589,377, filed Oct. 30, 2006, which claims priority on U.S. Provisional Patent Appl. No. 60/731,073, filed Oct. 28, 2005.

BACKGROUND OF THE INVENTION

1. Field of the Invention

The present disclosure relates generally to intelligent electronic devices for electrical power systems, and more particularly, to an intelligent electronic device having Bluetooth wireless communication capabilities for transmitting and receiving data without a hardwire connection.

2. Description of the Related Art

Electric utility companies ("utilities") track electric usage by customers by using power meters. These meters track the amount of power consumed at a particular location. These locations range from power substations, to commercial businesses, to residential homes. The electric utility companies use information obtained from the power meter to charge its customers for their power consumption, i.e. revenue metering.

A popular type of power meter is the socket-type revenue power meter, i.e., S-base or Type S meter. As its name implies, the meter itself plugs into a socket for easy installation, removal and replacement. Traditionally, socket-type revenue meters have been employed in residential applications for monitoring energy consumption in homes.

Other meter installations include panel mounted, switchboard mounted, and circuit breaker mounted. Typically, the power meter connects between utility power lines supplying electricity and a usage point, namely a residence or commercial place of business. A power meter may also be placed at a point within the utility's power grid, e.g., in a substation, to monitor power flowing through that point for distribution, power loss, or capacity monitoring.

The challenge with revenue and panel metering is to have them read quickly. Conventionally, to read these meters, reading personnel physically connect to the meter to download information therefrom or write down the readings from a face of the meter after visually inspecting them. However, this is a time consuming process and sometimes a difficult process when the meter is in a hard-to-reach location.

Other schemes have been used in the art to bring back data via proprietary wireless systems, the systems required users to purchase highly extensive specialized systems designed to read proprietary wireless systems. The systems required users to purchase highly extensive specialized systems designed to read proprietary solutions.

Therefore, a need exists for devices, systems and methods for providing a power meter with wireless communication capabilities for transmitting data without being in physical contact with the meter.

SUMMARY OF THE INVENTION

An intelligent electronic device (IED), e.g., an electrical power meter, having Bluetooth wireless communication capabilities for transmitting and receiving data without a hardwire connection is provided. The Bluetooth speaking meter of the present disclosure auto-negotiates when someone having a Bluetooth-enabled device simply walks or drives near the meter. This allows a Bluetooth-enabled PDA or PC computer to automatically collect data quickly from the IED or meter and eliminate the need for a technician to execute code or physically read the meter. There are many applications for this in the power metering industry such as diversion metering (e.g., reading a hidden installed meter on a poll to try to catch someone stealing electric), socket-type revenue meters and installed switchboard panel meters. Using Bluetooth technology, utilities can significantly save cost and maintenance infrastructure by using off the shelf components and hand held PDAs to read meters. Thus, since costs are cut significantly, automating meter reading becomes a much more attractive alternative.

According to one aspect of the present disclosure, an intelligent electronic device is provided including at least one sensor coupled to an electric circuit configured for measuring at least one power parameter of the electrical circuit and generating at least one analog signal indicative of the at least one power parameter; at least one analog to digital converter coupled to the at least one sensor configured for receiving the at least one analog signal and converting the at least one analog signal to at least one digital signal; a processor configured for receiving the at least one digital signal and calculating energy consumption data in the electrical circuit; and a transceiver configured for receiving the calculated energy consumption data from the processor and transmitting the calculated energy consumption data via a spread-spectrum frequency hopping technique.

In another aspect, the intelligent electronic device further includes a memory for storing at least one protocol stack for enabling the spread-spectrum frequency hopping technique. In one embodiment, the at least one protocol stack is a Bluetooth protocol stack.

In another aspect, a method for collecting data from an intelligent electronic device is provided. The method includes transmitting a first request for a communication session with the intelligent electronic device; receiving a second request from the intelligent electronic device for a passkey previously stored in the intelligent electronic device; transmitting the passkey to the intelligent electronic device; and in response to passkey, receiving data from the intelligent electronic device.

In a further aspect of the present disclosure, a system for collecting data from at least one intelligent electronic device includes at least one intelligent electronic device including at least one sensor coupled to an electric circuit configured for measuring at least one power parameter of the electrical circuit and generating at least one analog signal indicative of the at least one power parameter; at least one analog to digital converter coupled to the at least one sensor configured for receiving the at least one analog signal and converting the at least one analog signal to at least one digital signal; a processor configured for receiving the at least one digital signal and calculating energy consumption data in the electrical circuit; and a transceiver configured for receiving the calculated energy consumption data from the processor and transmitting the calculated energy consumption data via a spread-spectrum frequency hopping technique; and a data collection device configured for receiving the calculated energy consumption data from the at least one intelligent electronic device in response to supplying a pairing passkey to the intelligent electronic device.

The above and other aspects, features, and advantages of the present disclosure will become more apparent in light of the following detailed description when taken in conjunction with the accompanying drawings.

DETAILED DESCRIPTION OF THE PREFERRED EMBODIMENTS

Figure 1:
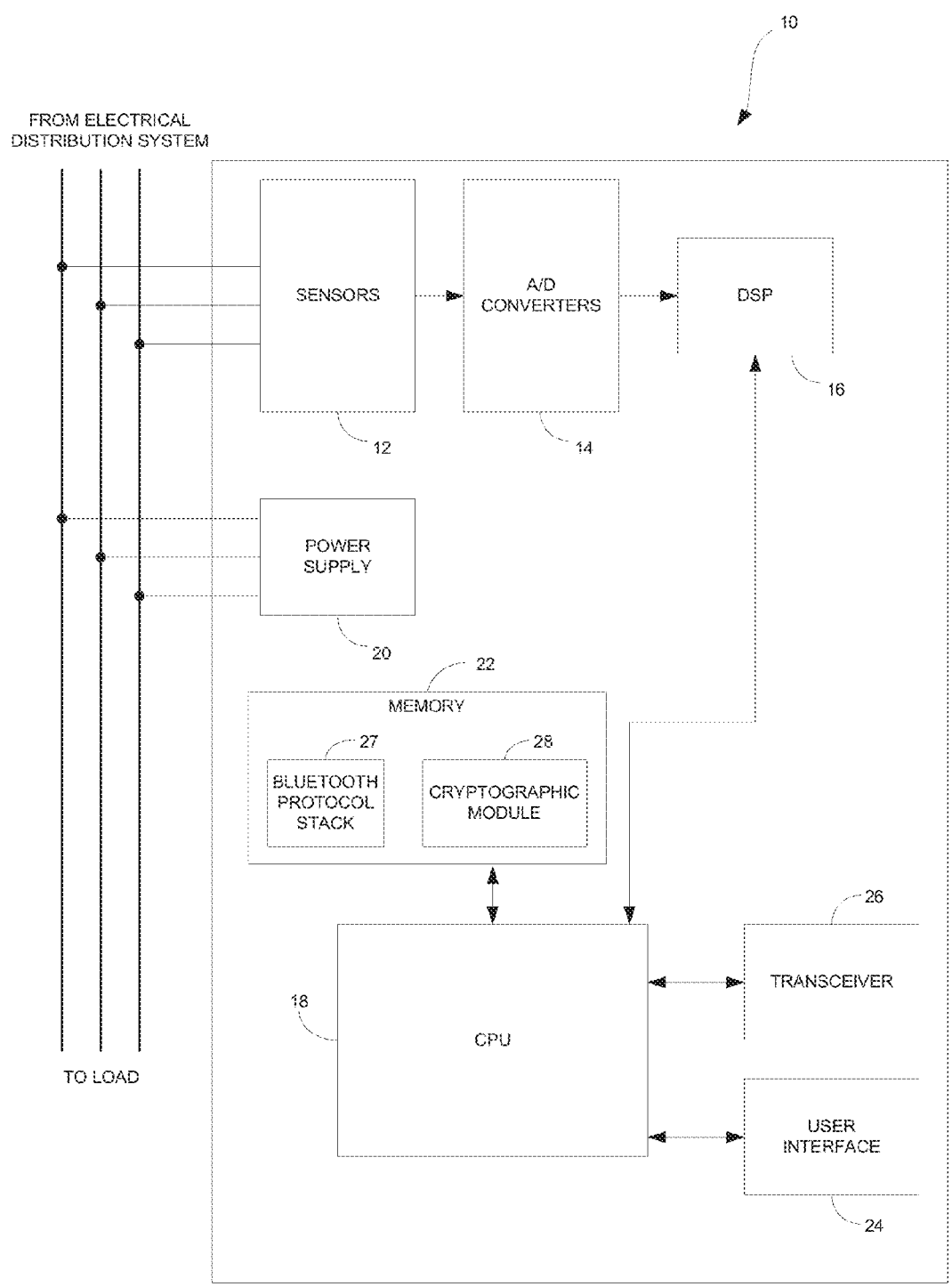
FIG. 1 is a diagram of an intelligent electronic device in accordance with an embodiment of the present disclosure.

Preferred embodiments of the present disclosure will be described herein below with reference to the accompanying drawings. In the following description, well-known functions or constructions are not described in detail to avoid obscuring the present disclosure in unnecessary detail.

As used herein, intelligent electronic devices ("IED's") include Programmable Logic Controllers ("PLC's"), Remote Terminal Units ("RTU's"), electric power meters, protective relays, fault recorders and other devices which are coupled with power distribution networks to manage and control the distribution and consumption of electrical power. A meter is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power which they are metering. Exemplary intelligent electronic devices are disclosed and described in the following commonly owned U.S. issued patents and published applications: U.S. Pat. No. 7,256,709 entitled "METER WITH IRDA PORT" filed on May 15, 2002; U.S. Patent Publication No. 2006/0071813 entitled "METER HAVING A COMMUNICATION INTERFACE FOR RECEIVING AND INTERFACING WITH A COMMUNICATION DEVICE" filed on Oct. 5, 2004; U.S. Patent Publication No. 2006/0077999 entitled "SYSTEM AND METHOD FOR SIMULTANEOUS COMMUNICATION ON MODBUS AND DNP 3.0 OVER ETHERNET FOR ELECTRONIC POWER METER" filed on Mar. 23, 2005; U.S. Pat. No. 7,305,310 entitled "SYSTEM AND METHOD FOR COMPENSATING FOR POTENTIAL AND CURRENT TRANSFORMERS IN ENERGY METERS" filed on Apr. 18, 2005; U.S. Patent Publication No. 2006/0161400 entitled "MULTIPLE ETHERNET PORTS ON POWER METER" filed on Jan. 19, 2005; U.S. Pat. No. 7,271,996 entitled "CURRENT INPUTS INTERFACE FOR AN ELECTRICAL DEVICE" filed on Dec. 3, 2004; U.S. Pat. No. 7,388,189 entitled "SYSTEM AND METHOD FOR CONNECTING ELECTRICAL DEVICES USING FIBER OPTIC SERIAL COMMUNICATION" filed on Jan. 24, 2005; U.S. Design Pat. No. D525,893 entitled "ELECTRONIC POWER METER" issued on Aug. 1, 2006; U.S. Pat. No. 7,184,904 entitled "SYSTEM AND METHOD FOR PROVIDING UNIVERSAL ADDITIONAL FUNCTIONALITY FOR POWER METERS" filed on Mar. 28, 2005; U.S. Pat. No. 7,337,081 entitled "METERING DEVICE WITH CONTROL FUNCTIONALITY AND METHOD THEREOF" filed on Jan. 27, 2006; U.S. Design Pat. No. D545,181 entitled "WALL MOUNT ASSEMBLY" filed on Mar. 7, 2005; U.S. Design Pat. No. D526,920 entitled "ELECTRONIC METER" issued on Aug. 22, 2006; U.S. Patent Publication No. 2006/0170409 entitled "TEST PULSES FOR ENABLING REVENUE TESTABLE PANEL METERS" filed on Dec. 22, 2005; U.S. Pat. No. 6,735,535 entitled "POWER METER HAVING AN AUTO-CALIBRATION FEATURE AND DATA ACQUISITION CAPABILITIES" issued on May 11, 2004; U.S. Pat. No. 6,636,030 entitled "REVENUE GRADE METER WITH HIGH-SPEED TRANSIENT DETECTION" issued on Oct. 21, 2002; U.S. Pat. No. 6,751,563 entitled "ELECTRONIC POWER METER" issued on Jun. 15, 2004; U.S. Pat. No. 7,155,350 entitled "SYSTEM AND METHOD UTILIZING VIRTUAL SWITCHING FOR ELECTRIC PANEL METERING" filed on Jul. 22, 2004; U.S. Pat. No. 7,294,997 entitled "ELECTRICAL METER INSTALLATION SYSTEM AND METHOD" filed on Jul. 22, 2004; U.S. Patent Publication No. 2006/0082355 entitled "TEST PULSES FOR ENABLING REVENUE TESTABLE PANEL METERS" filed on Oct. 20, 2004; U.S. Patent Publication No. 2006/0083260 entitled "SYSTEM AND METHOD FOR PROVIDING COMMUNICATION BETWEEN INTELLIGENT ELECTRONIC DEVICES VIA AN OPEN CHANNEL" filed on Oct. 20, 2004; and U.S. Pat. No. 7,304,586 entitled "ON-LINE WEB ACCESSED ENERGY METER" filed on Oct. 20, 2004, the contents of all of which are hereby incorporated by reference in their entireties.

An intelligent electronic device (IED) 10 for monitoring and determining an amount of electrical power usage by a consumer and for providing audible and visual indications to a user is illustrated in FIG. 1. Generally, the IED 10 includes sensors 12, a plurality of analog-to-digital (A/D) converters 14 and a processing system including a central processing unit (CPU) 18 and/or a digital signal processor (DSP) 16. The sensors 12 will sense electrical parameters, e.g., voltage and current, of the incoming lines from an electrical power distribution system. Preferably, the sensors will include current transformers and potential transformers, wherein one current transformer and one voltage transformer will be coupled to each phase of the incoming power lines. A primary winding of each transformer will be coupled to the incoming power lines and a secondary winding of each transformer will output a voltage representative of the sensed voltage and current. The output of each transformer will be coupled to the A/D converters 14 configured to convert the analog output voltage from the transformer to a digital signal that can be processed by the CPU 18 or DSP 16.

The CPU 18 is configured for receiving the digital signals from the A/D converters 14 to perform the necessary calculations to determine the power usage and controlling the overall operations of the IED 10. In another embodiment, the DSP 16 will receive the digital signals from the A/D converters 14 and perform the necessary calculations to determine the power usage to free the resources of the CPU 18. It is to be appreciated that in certain embodiments the CPU 18 may perform all the functions performed by the CPU 18 and DSP 16, and therefore, in these embodiments the DSP 16 will not be utilized.

A power supply 20 is also provided for providing power to each component of the IED 10. Preferably, the power supply 20 is a transformer with its primary windings coupled to the incoming power distribution lines and having an appropriate number of windings to provide a nominal voltage, e.g., 5 VDC, at its secondary windings. In other embodiments, power is supplied from an independent source to the power supply 20, e.g., from a different electrical circuit, an uninterruptible power supply (UPS), etc.

The IED 10 of the present disclosure will include a multimedia user interface 24 for interacting with a user and for communicating events, alarms and instructions to the user. The user interface 24 will include a display for providing visual indications to the user. The display may include a touch screen, a liquid crystal display (LCD), a plurality of LED number segments, individual light bulbs or any combination of these. The display may provide the information to the user in the form of alpha-numeric lines, computer-generated graphics, videos, animations, etc. The user interface 24 will also include a speaker or audible output means for audibly producing instructions, alarms, data, etc. The speaker will be coupled to the CPU 18 via a digital-to-analog converter (D/A) for converting digital audio files stored in a memory 22 to analog signals playable by the speaker. An exemplary interface is disclosed and described in commonly owned co-pending U.S. application Ser. No. 11/589,381, entitled "INTELLIGENT ELECTRONIC DEVICE HAVING AUDIBLE AND VISUAL INTERFACE", which claims priority to U.S. Provisional Patent Appl. No. 60/731,006, filed Oct. 28, 2005, the contents of which are hereby incorporated by reference in their entireties.

The IED 10 of the present disclosure will support various file types including but not limited to Microsoft Windows Media Video files (.wmv), Microsoft Photo Story files (.asf), Microsoft Windows Media Audio files (.wma), MP3 audio files (.mp3), JPEG image files (.jpg, .jpeg, .jpe, jfif), MPEG movie files (.mpeg, .mpg, .mpe, .m1v, .mp2v .mpeg2), Microsoft Recorded TV Show files (.dvr-ms), Microsoft Windows Video files (.avi) and Microsoft Windows Audio files (.wav).

In addition to storing audio and/or video files, memory 22 will store the sensed and generated data for further processing and for retrieval when called upon to be displayed at the IED 10 or from a remote location. The memory 22 includes internal storage memory, e.g., random access memory (RAM), or removable memory such as magnetic storage memory; optical storage memory, e.g., the various known types of CD and DVD media; solid-state storage memory, e.g., a CompactFlash card, a Memory Stick, SmartMedia card, MultiMediaCard (MMC), SD (Secure Digital) memory; or any other memory storage that exists currently or will exist in the future. By utilizing removable memory, an IED can be easily upgraded as needed.

The IED 10 will include a transceiver 26 for enabling wireless communications between the IED 10 and other computing devices, e.g., a desktop computer, laptop computer, other IEDs, etc. The transceiver 26 will include an antenna for wirelessly transmitting and receiving data and a Bluetooth chipset for decoding data received by the antenna and for encoding data to be transmitted by the antenna. The antenna may be disposed internally to the IED or mounted externally on the IED. The transceiver 26 will operate in accordance with the Bluetooth standard developed by the Bluetooth Special Interest Group (SIG). Generally, the transceiver 26 will communicate on a frequency of about 2.45 gigahertz, and in a range of about 2.402 GHz to about 2.480 GHz, and employ a spread-spectrum frequency hopping technique to avoid interference with other Bluetooth-enabled devices. In this technique, the transceiver will use 79 individual, randomly chosen frequencies within a designated range, changing frequencies 1600 times every second. This technique will minimize the risk the transceiver 26 will interfere with other Bluetooth-enabled devices, e.g., other IEDs or devices within a home when the IED is used in a residential application.

In memory 22, various Bluetooth protocols and/or other short range RF (radio frequency) protocols are stored. A Bluetooth protocol stack 27 may include a link management protocol (LMP), a logical link control and application protocol (L2CAP), a service discovery protocol (SDP), RFCOMM (i.e., a serial line emulation protocol), link manager (LM), and/or the like. The LM runs on the CPU 18 in the client to manage communications between itself and other Bluetooth devices via LMP, and/or the like. After the connection of a Bluetooth client with another device, SDP enables the querying and identification of the abilities of other Bluetooth devices. L2CAP provides multiplexing, packet segmentation and reassembly of data as it is communicated between the client and other Bluetooth enabled devices. Another protocol held in memory 22 is the RFCOMM, which is a serial line emulation protocol that enables Bluetooth devices to intercommunicate by emulating a serial line. These various protocols interact to encode and decode data as given by the CPU 18 through a base band. LMP and L2CAP run directly on top of base band. RFCOMM and SDP run on top of L2CAP. It is to be appreciated that Bluetooth protocol stacks are known in the art and the above described protocol stack is in accordance with at least the IEEE 802.15.1 standard which is directed to a Wireless Personal Area Network standard based on the Bluetooth v1.1 specifications. The IEEE 802.15.1 standard also includes a medium access control and physical layer specification. The IEEE 802.15.1 standard is incorporated by reference. Furthermore, an exemplary Bluetooth protocol stack is disclosed and described in U.S. Pat. No. 7,123,878, which is hereby incorporated by reference in its entirety.

Furthermore, the memory 22 will further include a cryptographic module 28 including stored instruction signals that is executed by the CPU 18, a cryptographic processor, and/or the like. Preferably, cryptographic processor interfaces will allow for expedition of encryption and/or decryption requests by the cryptographic module 28; however, the cryptographic module 28, alternatively, may run on a conventional CPU. Preferably, the cryptographic module 28 allows for the encryption and/or decryption of provided data. Preferably, the cryptographic module 28 allows for both symmetric and asymmetric (e.g., Pretty Good Protection (PGP)) encryption and/or decryption. Preferably, the cryptographic module 28 allows conventional cryptographic techniques such as, but not limited to: digital certificates (e.g., X.509 authentication framework), digital signatures, dual signatures, enveloping, password access protection, public key management, and/or the like. Preferably, the cryptographic module 28 will facilitate numerous (encryption and/or decryption) security protocols such as, but not limited to: checksum, Data Encryption Standard (DES), Elliptical Curve Encryption (ECC), International Data Encryption Algorithm (IDEA), Message Digest 5 (MD5, which is a one way hash function), passwords, RC5 (Rivest Cipher), Rijndael, RSA (which is an Internet encryption and authentication system that uses an algorithm developed in 1977 by Ron Rivest, Adi Shamir, and Leonard Adleman), Secure Hash Algorithm (SHA), Secure Socket Layer (SSL), Secure Hypertext Transfer Protocol (HTTPS), and/or the like. The cryptographic module 28 facilitates the process of "security authorization" whereby access to a resource is inhibited by a security protocol wherein the cryptographic module 28 effects authorized access to the secured resource. The cryptographic module 28 may communicate to and/or with other modules in a module collection, including itself, and/or facilities of the like. Preferably, the cryptographic module 28 supports encryption schemes allowing for the secure transmission of information across a communications network to enable a client to engage in secure transactions if so desired by users. The cryptographic module 28 facilitates the secure accessing of resources on a client and facilitates the access of secured resources on remote systems; i.e., it may act as a client and/or server of secured resources. Most frequently, the cryptographic module 28 communicates with information servers, operating systems, other program modules, and/or the like. The cryptographic module 28 may contain, communicate, generate, obtain, and/or provide program module, system, user, and/or data communications, requests, and/or responses. In one non-limiting example embodiment, such a cryptographic tool may be provided as a library within the operating system accessible to all other modules in a module collection through an application program interface (API). The cryptographic tool enables local processing of authentication information.

It is to be understood that the present disclosure may be implemented in various forms of hardware, software, firmware, special purpose processors, or a combination thereof. The IED 10 also includes an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

Figure 2:
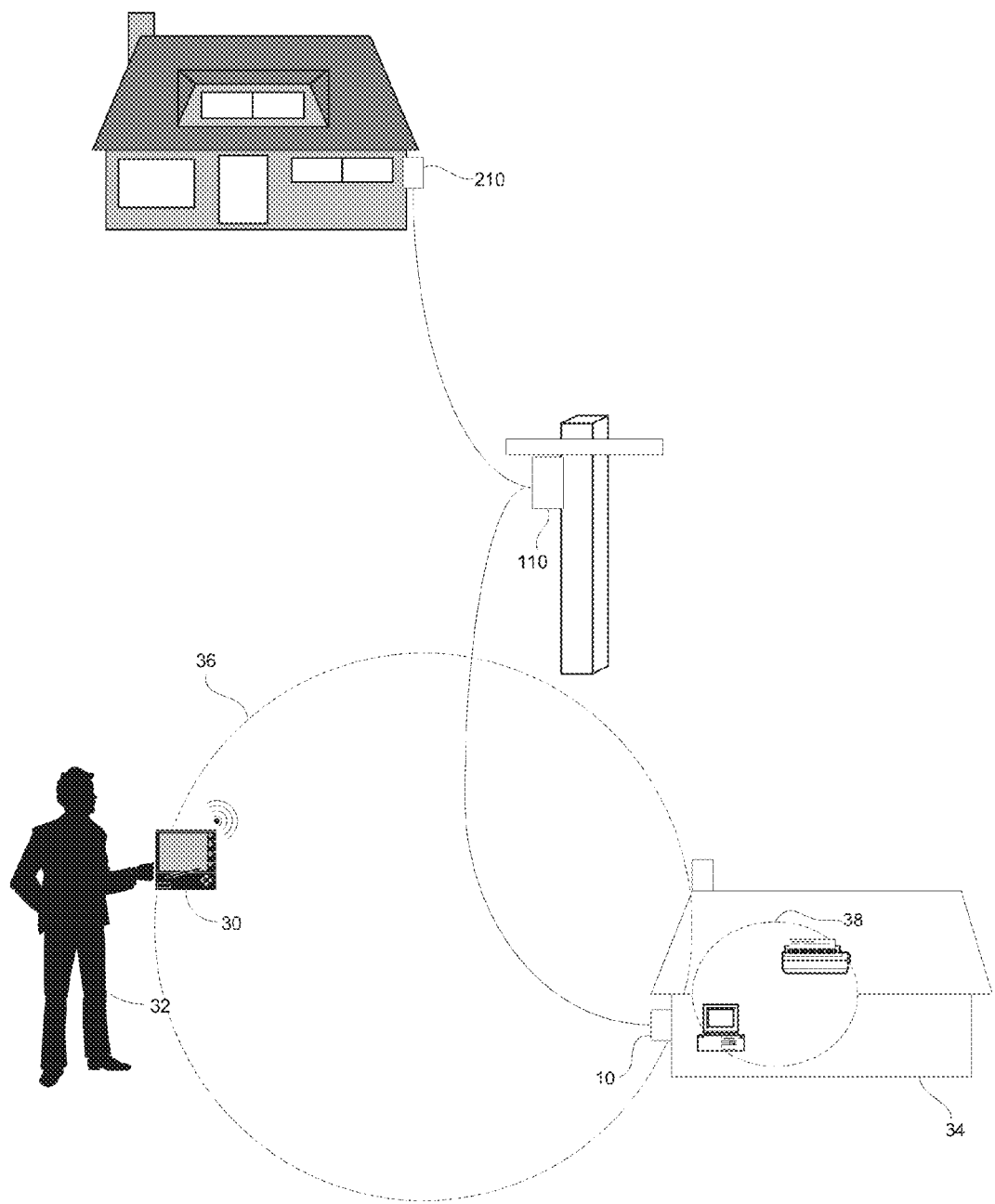
FIG. 2 is a system for wirelessly reading at least one meter according to an embodiment of the present disclosure.

Referring to FIG. 2, a system for wirelessly accessing at least one IED 10,110, 210 is illustrated. In the system, reading personnel 32, e.g., a technician from a utility, is equipped with a Bluetooth-enabled device 30 for accessing data in the IED. The device 30 may be a laptop computer, a PDA, a mobile phone, etc. When device 30 comes within range of at least one of the IEDs, the device 30 and at least one IED 10 auto-negotiates and forms a network, e.g., a piconet 36. Preferably, the at least one IED 10 includes an address established by the utility so the device 30 knows the IED 10 is a meter to be read. Once the piconet 36 is established, the device 30 will ignore signals from other piconets, e.g., a piconet 38 established between a Bluetooth-enabled computer and Bluetooth-enabled printer within the home 34. As the device 30 comes with range of the other IEDs 110, 210, the device 30 will auto-negotiate with each of these IEDs 110, 210 and add them to the established piconet 36. Once connected to the piconet 36, the device 30 will receive data, e.g., energy consumption, from each IED without physically connecting to each device 10, 110, 210 or getting close enough to the device to read face-to-face. In this manner, reading personnel 32 may read a plurality of the IEDs by simply walking within an established range of each IED. Furthermore, in a residential application where a series of homes are located along a street, the reading personnel may simply drive along the street with a Bluetooth-enabled device in the vehicle and read a large number of IEDs rapidly.

In another embodiment, the IED may include a separate power supply (not shown) for supplying power to the transceiver 26 at a level other than the power level supplied by power supply 20. It is to be appreciated that increasing the power output level of the transceiver 26 will increase its communication range. The transceiver power supply may be a variable power supply enabling each IED to have a settable transmission range.

It is to be appreciated that the transceiver 26 will employ authentication and encryption for securely transmitting data and preventing tampering. It is also to be appreciated that the IEDs will employ SCO (synchronous connection oriented) type data transmission so in addition to transmitting data from the IED, the IED will be able to receive data from a Bluetooth-enabled device, e.g., to receive a software upgrade. In other embodiments, the transceiver 26 will also employ ACL (asynchronous connectionless) type data transfer.

In a further embodiment of the present disclosure, a system for retrieving revenue metering data from a plurality of IEDs, revenue meters, is provided. In this embodiment, reading device 30 is configured as a data collection device or mobile billing device (MBD). The mobile billing device will retrieve revenue metering data from a plurality of Bluetooth-enabled IEDs configured in accordance with the present disclosure. The mobile billing device will contain a computer processing module, e.g., a microprocessor that will use computer software instructions that have been programmed into the module and conventional computer processing power to interact and organize the traffic flow between various other modules, e.g., a memory module, communications module, etc. The mobile billing device also includes an operating system and micro instruction code preferably residing in read only memory (ROM) (not shown). The various processes and functions described herein may either be part of the micro instruction code or part of an application program (or a combination thereof) which is executed via the operating system. Exemplary operating systems include but are not limited to SymbianOS, Windows Mobile/Windows CE, Palm OS, Linux, Blackberry OS, BREW, etc. which have been developed for mobile computing applications and can handle both data computing and communication applications, e.g., voice communications.

Figure 3:
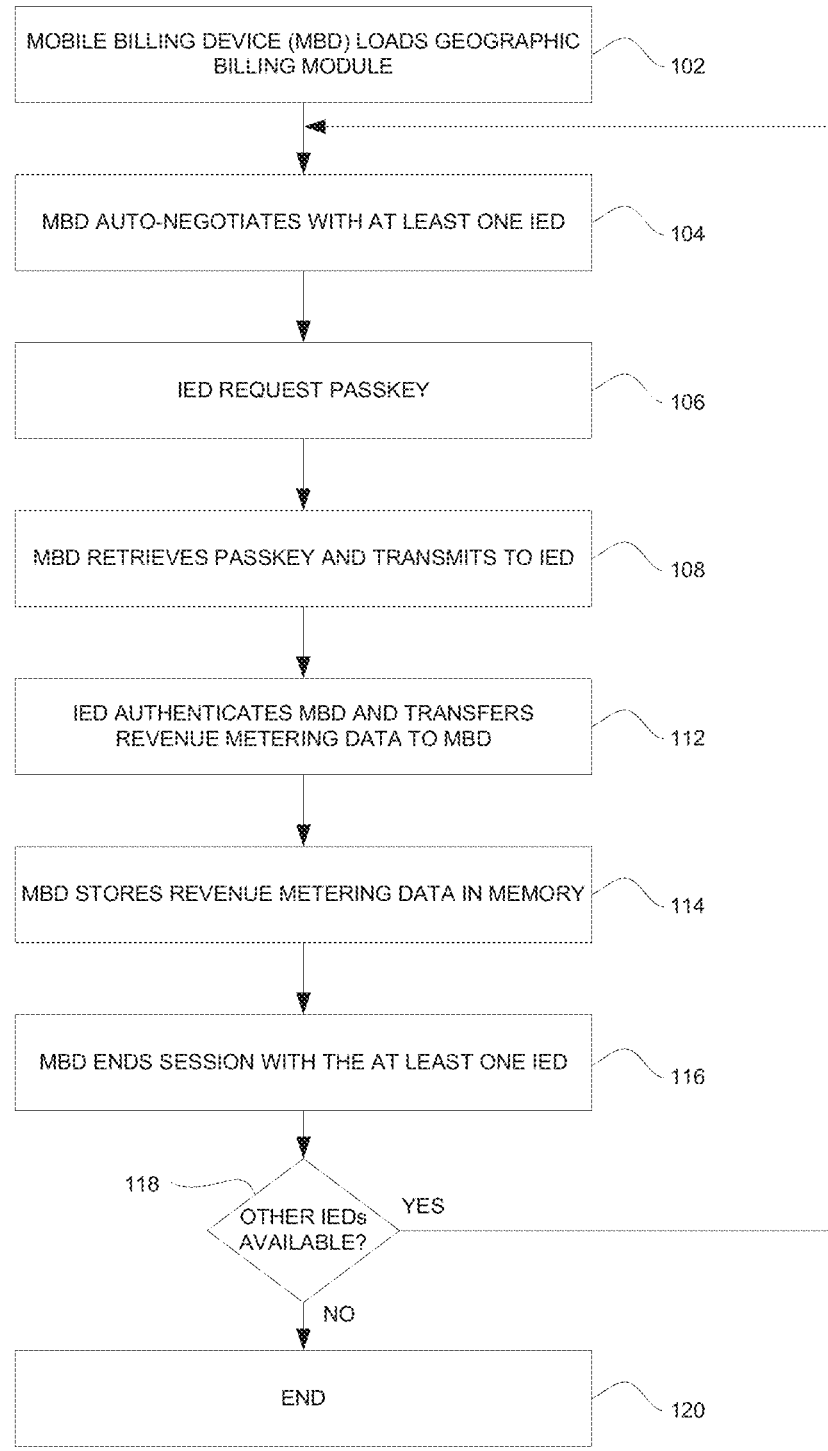
FIG. 3 is a flow chart illustrating a method for collecting revenue metering data from a plurality of intelligent electronic devices in accordance with the present disclosure.
Figure 4:
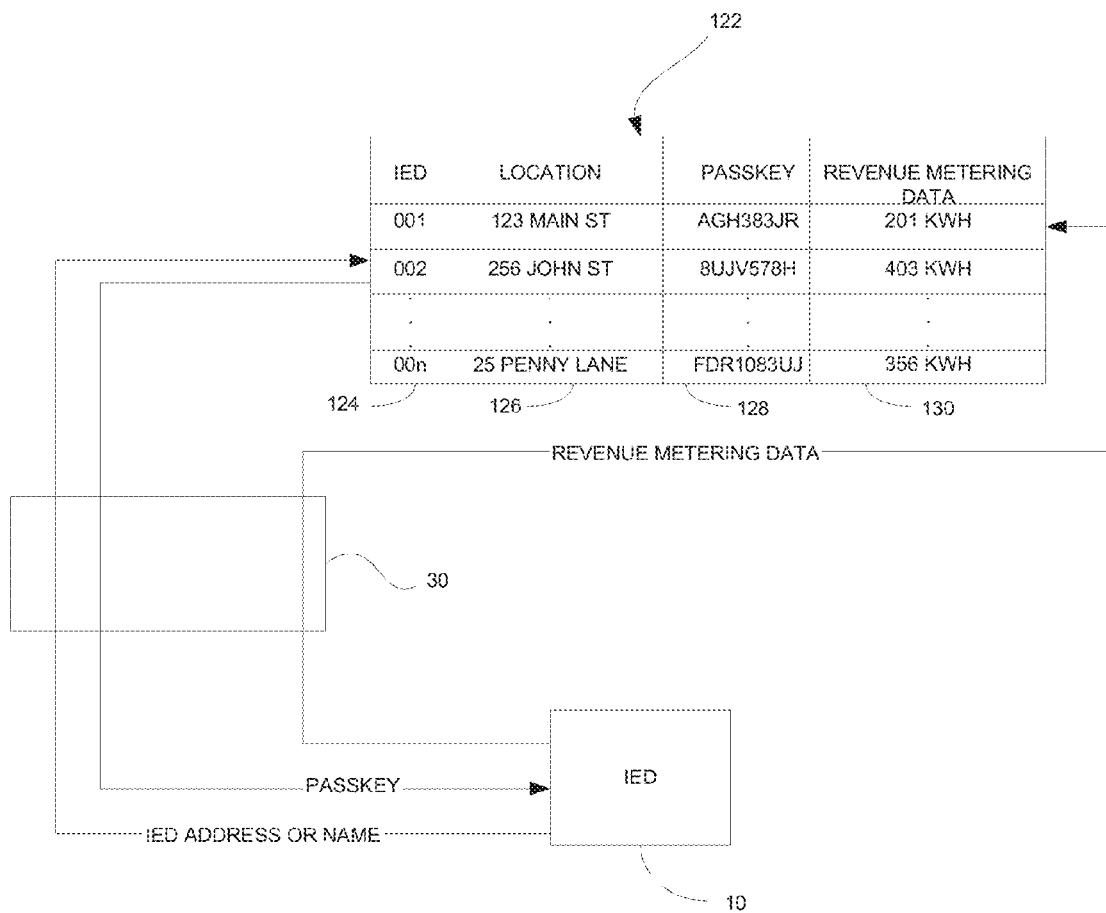
FIG. 4 is illustrates the overall flow of data in a system for retrieving revenue metering data from a plurality of IEDs in accordance with the present disclosure.

Referring to FIGS. 3 and 4, the system for retrieving revenue metering data from a plurality of IEDs will be described. It is to be appreciated that under the Bluetooth protocol pairs of devices, e.g., an IED 10 and mobile billing device 30, may establish a trusted relationship by learning (e.g., by user input) a shared secret known as a "passkey". A device that wants to communicate only with a trusted device can cryptographically authenticate the identity of the other device. Trusted devices may also encrypt the data that they exchange over the air so that no one can listen in. The encryption can however be turned off and passkeys are stored on the device's file system and not the Bluetooth transceiver itself. Since a Bluetooth address is permanent, a pairing will be preserved even if the Bluetooth name is changed. Devices will generally require pairing or will prompt the user before it allows a remote device to use any or most of its services.

Initially, in step 102, the mobile billing device (MBD) 30 will load a billing module 122 corresponding to a particular geographic location. The billing module 122 will include a database having a plurality of records relating to IEDs 10 in a known location. The database of the billing module will include but is not limited to data such as an IED identifier 124, e.g., an address or name of the IED, a location 126 of the IED, a passkey 128 associated with the IED and a record field 130 for storing revenue metering data relating to an IED.

Once the billing module is loaded, an operator of the MBD 30, e.g., a meter reader, will come into close proximity with at least one IED 10 to auto-negioate with the IED 10 (step 104). Once a communication session is open, the IED 10 will request a passkey to determine if a valid pairing was established (step 106). Based on the IED identifier, e.g., an address or name of the IED, the MBD 30 will retrieve a passkey 128 associated with the IED identifier 124 and transmit the passkey to the IED (step 108). The IED 10 will then authenticate the MBD 30 and transfer the revenue billing data stored in memory, e.g., memory 22, to the MBD 30 (step 112). The MBD 30 will then store the revenue metering data in the billing module 122 in the record field 130.

In step 116, the MBD 30 will end the session with the IED and will determine if any other IEDs are available (step 118). If other IEDs are available, the MBD 30 will process the other IEDs by repeating the above described process from step 104; otherwise, the process will end in step 120.

By using the above described system and method of the present disclosure, a utility operator can retrieve revenue meter information from a large number of end users, e.g., residential consumer, by simply coming into close proximity of each IED without making direct physical contact or being close enough to the IED to read information from its display or interface. In this manner, a large number of IEDs can be read in a relatively short period of time.

Figure 5:
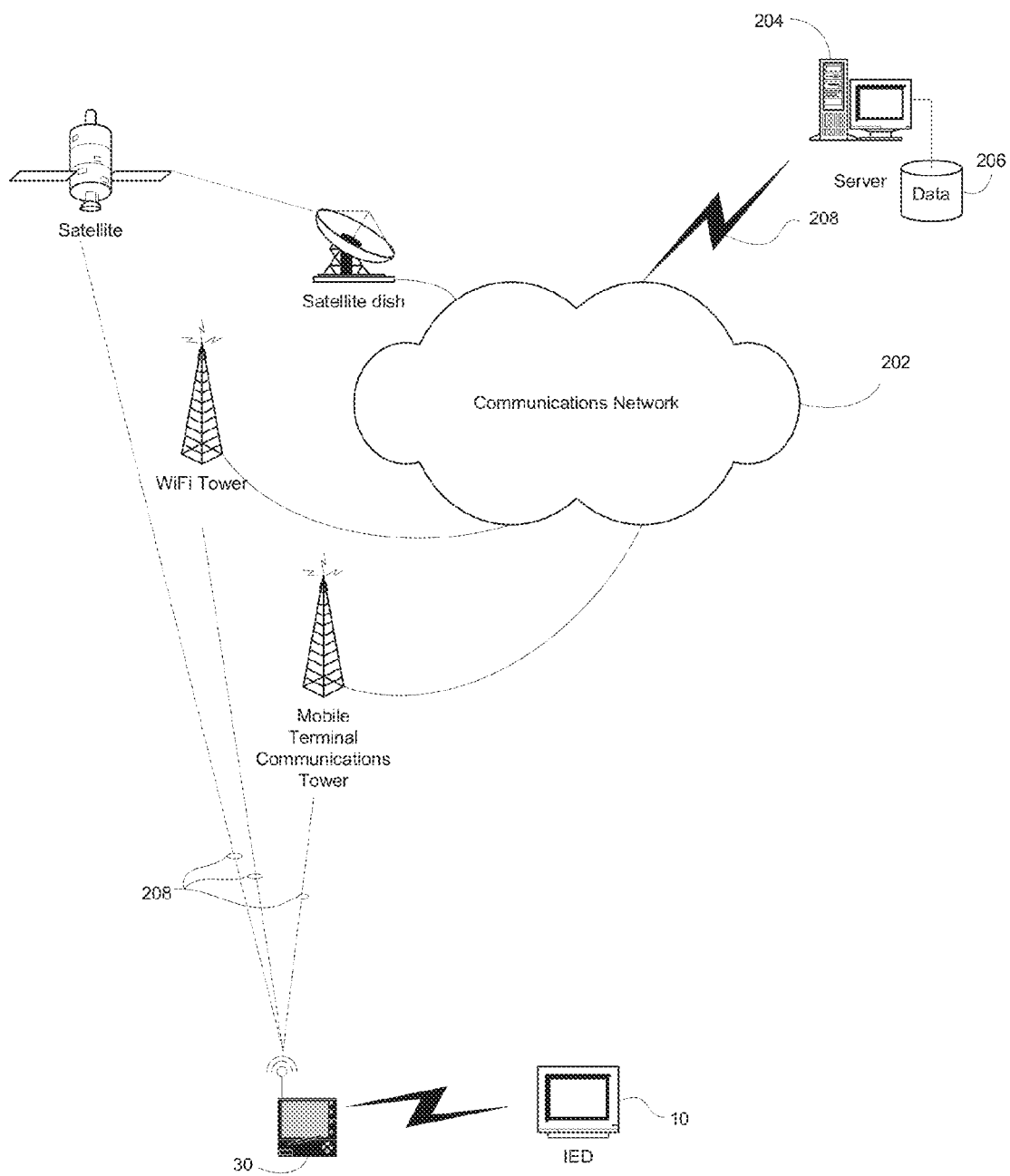
FIG. 5 is a system for wirelessly reading at least one meter according to another embodiment of the present disclosure.

It is to be appreciated that the data collected in the billing module 122 can then be uploaded to a computer and manipulated to create invoices for individual end users. The MBD 30 will upload the collected data by hardwired synchronization with the computer and/or upload the collected data to a remote server 204 over a communications network 202, e.g., the Internet, by any known means, for example, a hardwired or wireless connection, such as dial-up, hardwired, cable, DSL, satellite, cellular, PCS, wireless transmission (e.g., 802.11a/b/g), etc., as shown in FIG. 5. It is to be appreciated that the network 202 may be a local area network (LAN), wide area network (WAN), the Internet or any known network that couples a plurality of computers to enable various modes of communication via network messages. Furthermore, the server and MBD 30 will communicate using the various known protocols 208 such as Transmission Control Protocol/Internet Protocol (TCP/IP), File Transfer Protocol (FTP), Hypertext Transfer Protocol (HTTP), etc. and secure protocols such as Internet Protocol Security Protocol (IPSec), Point-to-Point Tunneling Protocol (PPTP), Secure Sockets Layer (SSL) Protocol, etc. In another embodiment, the MBD 20 will operate on the wireless GPRS (General Packet Radio Service) data protocol or a 3G protocol such as W-CDMA, CDMA2000 and TD-SCDMA, both of which have the ability to carry both voice and data over the same service. Once uploaded, the data collected from the IEDs may be stored in database 206 at the remote server 204.

In another embodiment, a meter reading device 30 is configured as a mobile communications terminal, e.g., a cellular phone or cellular phone enabled PDA, to automatically e-mail to a secure e-mail server 204 (e.g., POP3 server) or other e-mail infrastructure all revenue data, memory and other diagnostic or power quality data of the utility meter upon wirelessly reading the meter or IED. Using this system, the utility will have the data transmitted contemporaneously from the meter being read. The technology will significantly reduce man hours in transferring data and will allow the data to be sent automatically even when there is no dedicated infrastructure such as WIFI or WAN available.

While the disclosure has been shown and described with reference to certain preferred embodiments thereof, it will be understood by those skilled in the art that various changes in form and detail may be made therein without departing from the spirit and scope of the disclosure.

What is claimed is:

1. A system comprising:

a plurality of intelligent electronic devices, each intelligent electronic device including a plurality of sensors configured to sense electrical signals from an electrical distribution system, a plurality of analog-to-digital converters configured to convert the sensed electrical signals to digital signals, a processing device configured to receive the digital signals, a memory, a transceiver, and a cryptographic module, each intelligent electronic device being installed at a specific location associated with a physical address, the processing device of each intelligent electronic device being configured to calculate electrical energy consumption data at the specific location and store the calculated electrical energy consumption data in the memory, the transceiver configured to receive the calculated electrical energy consumption data from the processor and wirelessly transmit the calculated electrical energy consumption data via a spread-spectrum frequency hopping technique, the cryptographic module of each intelligent electronic device being configured to encrypt the calculated electrical energy consumption data, and each intelligent electronic device configured to store a unique identifier and a unique passkey in the memory; and a portable data collection device comprising a billing module, the portable data collection device configured to be transported throughout an area to automatically collect the calculated electrical energy consumption data from the plurality of intelligent electronic devices via wireless communication with the plurality of intelligent electronic devices;

wherein the billing module of the portable data collection device comprises a database including an entry for each of the intelligent electronic devices, each entry including data associated to each corresponding intelligent electronic device, each entry configured to pre-store the unique identifier for a particular intelligent electronic device, to pre-store the physical address corresponding to the specific location where the particular intelligent electronic device is installed, and to pre-store the passkey for the particular intelligent electronic device, each entry further including a record field for the particular intelligent electronic devices, wherein the database of the billing module is further configured to store calculated electrical energy consumption data received from the plurality of intelligent electronic devices in the corresponding record field for each of the intelligent electronic devices;

wherein, when the portable data collection device is within a range of a first intelligent electronic device of the plurality of intelligent electronic devices, the portable data collection device is configured to auto-negotiate with a transceiver of the first intelligent electronic device to establish a piconet and wirelessly receive from the transceiver of the first intelligent electronic device the unique identifier corresponding to the first intelligent electronic device via the spread-spectrum frequency hopping technique;

wherein, upon receiving the unique identifier corresponding to the first intelligent electronic device, the portable data collection device is further configured to retrieve from the billing module the passkey for the first intelligent electronic device corresponding to the unique identifier;

wherein the portable data collection device is further configured to wirelessly transmit the corresponding passkey for the first intelligent electronic device via the spread-spectrum frequency hopping technique to the transceiver of the first intelligent electronic device;

wherein, upon determining that the passkey received from the portable data collection device is valid, the first intelligent electronic device is configured to retrieve the calculated electrical energy consumption data from the memory and to wirelessly transmit the calculated electrical energy consumption data to the portable data collection device via the spread-spectrum frequency hopping technique;

wherein the portable data collection device is further configured to receive the calculated electrical energy consumption data from the first intelligent electronic device and store the calculated electrical energy consumption data in the record field of the entry in the billing module corresponding to the first intelligent electronic device; and wherein, contemporaneously with receiving the calculated electrical energy consumption data from the first intelligent electronic device, the portable data collection device is further configured to automatically transmit the calculated electrical energy consumption data corresponding to the first intelligent electronic device to a server.

2. The system of claim 1, wherein the portable data collection device is configured to transmit the calculated electrical energy consumption data to the server via an e-mail protocol.

3. The system of claim 1, wherein the portable data collection device is configured to auto-negotiate with a transceiver of a second intelligent electronic device of the plurality of intelligent electronic devices to add the second intelligent electronic device to the piconet, wirelessly receive from the second intelligent electronic device the unique identifier corresponding to the second intelligent electronic device via a spread-spectrum frequency hopping technique, retrieve from the billing module the passkey for the second intelligent electronic device corresponding to the unique identifier received from the second intelligent electronic device, and wirelessly transmit the corresponding passkey to the second intelligent electronic device via the spread-spectrum frequency hopping technique.

4. The system of claim 3, wherein, upon determining that the passkey received from the portable data collection device is valid, the second intelligent electronic device is configured to wirelessly transmit the calculated electrical energy consumption data to the portable data collection device via the spread-spectrum frequency hopping technique.

5. The system of claim 1, wherein each intelligent electronic device is further configured to store at least one protocol stack for enabling the spread-spectrum frequency hopping technique.

6. The system of claim 5, wherein the at least one protocol stack is a Bluetooth protocol stack.

7. The system of claim 1, wherein the portable data collection device is further configured to wirelessly transmit upgrade data to the plurality of intelligent electronic devices via a synchronous connection oriented (SCO) type data transmission.

8. The system of claim 1, wherein the plurality of intelligent electronic devices are configured as at least one of socket-type revenue meters, switchboard panel meters, and circuit breaker mounted meters.

9. The system of claim 1, wherein the portable data collection device is configured to transmit the electrical energy consumption data to the server via a cellular transmission protocol.

10. The system of claim 1, wherein the transceiver of each intelligent electronic device transmits on a frequency of about 2.45 gigahertz.

11. The system of claim 1, wherein the transceiver of each intelligent electronic device transmits on a frequency of about 2.402 gigahertz to 2.480 gigahertz.

12. The system of claim 1, wherein the cryptographic module encrypts the calculated electrical energy consumption data using at least one of security protocols comprising checksum, Data Encryption Standard (DES), Elliptical Curve Encryption (ECC), International Data Encryption Algorithm (IDEA), Message Digest 5 (MD5), Rivest Cipher, Rivest Shamir Adleman (RSA), Rijndael, Secure Hash Algorithm (SHA), Secure Socket Layer (SSL), and/or Secure Hypertext Transfer Protocol (HTTPS).

13. A portable data collection device comprising:
a processing device configured to control operations of the portable data collection device;
a billing module having a database including an entry for each of a plurality of intelligent electronic devices installed at a plurality of locations within a geographic area, each entry including data associated to each corresponding intelligent electronic device, each entry configured to pre-store a unique identifier for a particular intelligent electronic device, to pre-store a unique passkey for the particular intelligent electronic device, and to pre-store a unique physical address associated with the particular intelligent electronic device within the geographic area, each entry further including a record field for the particular intelligent electronic device, each of the plurality of intelligent electronic devices being configured to calculate electrical energy consumption data at the respective location, wherein the database of the billing module is further configured to store the calculated electrical energy consumption data received from each of the plurality of intelligent electronic devices in the corresponding record field for each of the intelligent electronic devices;
a short-range transceiver configured such that when the portable data collection device is within a range of a first Intelligent electronic device of the plurality of intelligent electronic devices, the short-range transceiver auto-negotiates with a transceiver of the first Intelligent electronic device to establish a piconet; and
a communication device;
wherein the processing device is configured to determine the unique identifier corresponding to the first intelligent electronic device and retrieve the unique passkey from the database of the billing module corresponding to the first intelligent electronic device;
wherein the short-range transceiver is configured to wirelessly transmit the corresponding unique passkey to the first intelligent electronic device via a spread-spectrum frequency hopping technique and wirelessly receive the calculated energy consumption data from the first intelligent electronic device via the spread-spectrum frequency hopping technique when the transmitted unique passkey is determined to be valid;

wherein the processing device is configured to store the received calculated energy consumption data in the record field of the entry in the billing module corresponding to the first intelligent electronic device; and wherein, contemporaneously with receiving the calculated electrical energy consumption data from the first intelligent electronic device, the communication device is configured to upload to a server the received energy consumption data calculated by the first intelligent electronic device: and wherein, the portable data collection device is configured to be transported throughout an area to automatically collect electrical energy consumption data from the plurality of intelligent electronic devices via the short-range transceiver.

14. The portable data collection device of claim 13, wherein the communication device is configured to upload the calculated energy consumption data via a cellular transmission protocol.

15. The portable data collection device of claim 13, wherein the communication device is configured to upload the calculated electrical energy consumption data via an email protocol.

16. The portable data collection device of claim 13 wherein the short-range transceiver is configured to wirelessly transmit upgrade data to one or more of the plurality of intelligent electronic devices via a synchronous connection oriented (SCO) type data transmission.

17. An intelligent electronic device comprising:
at least one sensor coupled to an electrical circuit configured for measuring at least one power parameter of the electrical circuit and generating at least one analog signal indicative of the at least one power parameter;
at least one analog to digital converter coupled to the at least one sensor configured for receiving the at least one analog signal and converting the at least one analog signal to at least one digital signal;
a processor configured for receiving the at least one digital signal and calculating electrical energy consumption data in the electrical circuit;
a transceiver configured for receiving the calculated electrical energy consumption data from the processor and wirelessly transmitting the calculated electrical energy consumption data via a spread-spectrum frequency hopping technique to a portable remote reading device, wherein the portable remote reading device is configured to be carried throughout a particular geographical area and wirelessly communicate with a plurality of intelligent electronic devices located within the particular geographical area to automatically collect electrical energy consumption data from the plurality of intelligent electronic devices via wireless communication with the plurality of intelligent electronic devices, wherein the portable remote reading device is further configured to store an entry for each of the plurality of intelligent electronic devices in the particular geographical area, each entry including data associated to each corresponding intelligent electronic device, wherein each entry includes a unique identifier of a particular intelligent electronic device, a specific location where the particular intelligent electronic device is installed, a passkey for the particular intelligent electronic device, and a record field for the particular intelligent electronic device, wherein each intelligent electronic device has a passkey that is different from the other passkeys, wherein the transceiver is further configured to transmit the calculated electrical energy consumption data to the portable remote reading device in response to the portable remote reading device transmitting a valid passkey corresponding with the respective intelligent electronic device to the transceiver, wherein the portable remote reading device is configured to store the calculated electrical energy consumption data in the record field of the entry corresponding to the intelligent electronic device and, contemporaneously with receiving the calculated electrical energy consumption data from the transceiver, automatically transmit the calculated electrical energy consumption data to a server; and a cryptographic module configured for encrypting the calculated electrical energy consumption data and establishing a secure wireless communication channel with the portable remote reading device, wherein, when the portable remote reading device Is within a range of the intelligent electronic device, the cryptographic module auto-negotiates with the portable remote reading device to allow communication between the intelligent electronic device and the portable remote reading device, wherein the cryptographic module is further configured to request a respective passkey associated with the intelligent electronic device and establish the secure wireless communication channel with the portable remote reading device after receiving the respective passkey from the portable remote reading device, and wherein the secure wireless communication channel enables the wireless transmission of encrypted calculated electrical energy consumption data.

18. The intelligent electronic device of claim 17, further comprising a memory for storing at least one protocol stack for enabling the spread-spectrum frequency hopping technique.

19. The intelligent electronic device of claim 18, wherein the at least one protocol stack is a Bluetooth protocol stack.

20. The intelligent electronic device of claim 17, wherein the transceiver transmits on a frequency of about 2.45 gigahertz.

21. The intelligent electronic device of claim 17, wherein the transceiver transmits on a frequency of about 2.402 gigahertz to 2.480 gigahertz.

22. The intelligent electronic device of claim 17, wherein the cryptographic module encrypts the calculated electrical energy consumption data using at least one of security protocols comprising checksum, Data Encryption Standard (DES), Elliptical Curve Encryption (ECC), International Data Encryption Algorithm (IDEA), Message Digest 5 (MD5), Rivest Cipher, Rivest Shamir Adleman (RSA), Rijndael, Secure Hash Algorithm (SHA), Secure Socket Layer (SSL), and/or Secure Hypertext Transfer Protocol (HTTPS).

23. The intelligent electronic device of claim 17, wherein the intelligent electronic device is configured as a socket-type revenue meter.

24. The intelligent electronic device of claim 17, wherein the intelligent electronic device is configured as a switchboard panel meter.

25. The intelligent electronic device of claim 17, wherein the intelligent electronic device is configured as a circuit breaker mounted meter.

* * * * *